US011062936B1

(12) United States Patent
Moore et al.

(10) Patent No.: US 11,062,936 B1
(45) Date of Patent: Jul. 13, 2021

(54) TRANSFER STAMPS WITH MULTIPLE SEPARATE PEDESTALS

(71) Applicant: X Display Company Technology Limited, Dublin (IE)

(72) Inventors: Tanya Yvette Moore, Hurdle Mills, NC (US); David Gomez, Holly Springs, NC (US)

(73) Assignee: X Display Company Technology Limited, Dublin (IE)

( * ) Notice: Subject to any disclaimer, the term of this patent is extended or adjusted under 35 U.S.C. 154(b) by 3 days.

(21) Appl. No.: 16/721,897

(22) Filed: Dec. 19, 2019

(51) Int. Cl.
| | |
|---|---|
| H01L 21/687 | (2006.01) |
| B29C 59/02 | (2006.01) |
| H01L 21/677 | (2006.01) |
| H01L 21/683 | (2006.01) |

(52) U.S. Cl.
CPC .......... *H01L 21/6875* (2013.01); *B29C 59/02* (2013.01); *B29C 59/026* (2013.01); *H01L 21/677* (2013.01); *H01L 21/67706* (2013.01); *H01L 21/683* (2013.01); *H01L 21/68757* (2013.01); *H01L 21/68764* (2013.01)

(58) Field of Classification Search
CPC ..... B29C 59/002; B29C 59/02; B29C 59/026; H01L 21/683; H01L 21/677; H01L 21/6875; H01L 21/68757
See application file for complete search history.

(56) References Cited

U.S. PATENT DOCUMENTS

| | | | |
|---|---|---|---|
| 4,934,267 A | 6/1990 | Hashimoto et al. | |
| 5,205,032 A | 4/1993 | Kuroda et al. | |
| 5,265,533 A | 11/1993 | Svantesson et al. | |
| 5,882,532 A | 3/1999 | Field et al. | |
| 5,900,160 A | 5/1999 | Whitesides et al. | |
| 6,142,358 A | 11/2000 | Cohn et al. | |
| 6,180,239 B1 | 1/2001 | Whitesides et al. | |
| 6,555,408 B1 | 4/2003 | Jacobsen et al. | |

(Continued)

FOREIGN PATENT DOCUMENTS

| | | |
|---|---|---|
| CN | 1883957 A | 12/2006 |
| CN | 101681695 A | 3/2010 |

(Continued)

OTHER PUBLICATIONS

Bietsch, A. and Michel, B., Conformal contact and pattern stability of stamps used for soft lithography, J. Appl. Phys., 88(7):4310-4318, (2000).

(Continued)

*Primary Examiner* — Kaitlin S Joerger
(74) *Attorney, Agent, or Firm* — Choate, Hall & Stewart LLP; William R. Haulbrook; Michael D. Schmitt

(57) ABSTRACT

A stamp for micro-transfer printing comprises a rigid support having a support coefficient of thermal expansion (support CTE). Pedestals are disposed on (e.g., directly on and in contact with) the rigid support. Each of the pedestals is spatially separated from any other of the pedestals. The pedestals have a pedestal coefficient of thermal expansion (pedestal CTE) and the pedestal CTE is greater than the support CTE. Posts are disposed on (e.g., directly on and in contact with) each of the pedestals. Each post has a post coefficient of thermal expansion (post CTE) that is greater than the support CTE.

20 Claims, 10 Drawing Sheets

(56) References Cited

U.S. PATENT DOCUMENTS

| | | |
|---|---|---|
| 6,825,559 B2 | 11/2004 | Mishra et al. |
| 6,969,624 B2 | 11/2005 | Iwafuchi et al. |
| 7,195,733 B2 | 3/2007 | Rogers et al. |
| 7,434,512 B2 | 10/2008 | Bietsch et al. |
| 7,521,292 B2 | 4/2009 | Rogers et al. |
| 7,605,053 B2 | 10/2009 | Couillard et al. |
| 7,622,367 B1 | 11/2009 | Nuzzo et al. |
| 7,662,545 B2 | 2/2010 | Nuzzo et al. |
| 7,691,656 B2 | 4/2010 | Bader et al. |
| 7,704,684 B2 | 4/2010 | Rogers et al. |
| 7,799,699 B2 | 9/2010 | Nuzzo et al. |
| 7,875,313 B2 | 1/2011 | Blanchet et al. |
| 7,927,976 B2 | 4/2011 | Menard |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 8,110,425 B2 | 2/2012 | Yun |
| 8,198,621 B2 | 6/2012 | Rogers et al. |
| 8,217,381 B2 | 7/2012 | Rogers et al. |
| 8,261,660 B2 | 9/2012 | Menard |
| 8,333,860 B1 | 12/2012 | Bibl et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,480,942 B2 | 7/2013 | Shannon et al. |
| 8,506,867 B2 | 8/2013 | Menard |
| 8,558,243 B2 | 10/2013 | Bibl et al. |
| 8,664,699 B2 | 3/2014 | Nuzzo et al. |
| 8,722,458 B2 | 5/2014 | Rogers et al. |
| 8,754,396 B2 | 6/2014 | Rogers et al. |
| 8,794,501 B2 | 8/2014 | Bibl et al. |
| 8,835,940 B2 | 9/2014 | Hu et al. |
| 8,865,489 B2 | 10/2014 | Rogers et al. |
| 8,877,648 B2 | 11/2014 | Bower et al. |
| 8,889,485 B2 | 11/2014 | Bower |
| 8,895,406 B2 | 11/2014 | Rogers et al. |
| 8,934,259 B2 | 1/2015 | Bower et al. |
| 8,941,215 B2 | 1/2015 | Hu et al. |
| 9,105,714 B2 | 8/2015 | Hu et al. |
| 9,161,448 B2 | 10/2015 | Menard et al. |
| 9,166,114 B2 | 10/2015 | Hu et al. |
| 9,217,541 B2 | 12/2015 | Bathurst et al. |
| 9,238,309 B2 | 1/2016 | King et al. |
| 9,307,652 B2 | 4/2016 | Bower |
| 9,308,649 B2 | 4/2016 | Golda et al. |
| 9,358,775 B2 * | 6/2016 | Bower ................. B41F 16/0046 |
| 9,368,683 B1 | 6/2016 | Meitl et al. |
| 9,401,344 B2 | 7/2016 | Bower et al. |
| 9,412,727 B2 | 8/2016 | Menard et al. |
| 9,548,332 B2 | 1/2017 | Hu et al. |
| 9,550,353 B2 | 1/2017 | Bower et al. |
| 9,555,644 B2 | 1/2017 | Rogers et al. |
| 9,601,356 B2 | 3/2017 | Bower et al. |
| 9,640,715 B2 | 5/2017 | Bower et al. |
| 9,704,821 B2 * | 7/2017 | Meitl ................. H01L 21/7806 |
| 9,765,934 B2 | 9/2017 | Rogers et al. |
| 9,929,053 B2 | 3/2018 | Bower et al. |
| 9,997,501 B2 * | 6/2018 | Bower ................. H01L 25/0753 |
| 10,181,483 B2 | 1/2019 | Menard et al. |
| 10,252,514 B2 * | 4/2019 | Bower ................. H01L 21/683 |
| 10,262,966 B2 * | 4/2019 | Bower ................. H01L 25/072 |
| 10,692,844 B2 * | 6/2020 | Cok ................. H01L 33/505 |
| 10,796,938 B2 * | 10/2020 | Radauscher ............ H05K 1/111 |
| 10,899,067 B2 * | 1/2021 | Moore ................. B41F 17/00 |
| 2003/0027083 A1 | 2/2003 | Fuller et al. |
| 2004/0121568 A1 | 6/2004 | Kim et al. |
| 2005/0238967 A1 | 10/2005 | Rogers et al. |
| 2005/0285246 A1 | 12/2005 | Haba et al. |
| 2008/0054439 A1 | 3/2008 | Malhan et al. |
| 2008/0055581 A1 | 3/2008 | Rogers et al. |
| 2008/0108171 A1 | 5/2008 | Rogers et al. |
| 2008/0185705 A1 | 8/2008 | Osborn et al. |
| 2008/0202365 A1 | 8/2008 | Schneider et al. |
| 2009/0133914 A1 | 5/2009 | Dellmann et al. |
| 2009/0199960 A1 | 8/2009 | Nuzzo et al. |
| 2010/0018420 A1 | 1/2010 | Menard |
| 2010/0062098 A1 | 3/2010 | Ando et al. |
| 2010/0123268 A1 | 5/2010 | Menard |
| 2010/0155989 A1 | 6/2010 | Ishii et al. |
| 2010/0248484 A1 | 9/2010 | Bower et al. |
| 2010/0308008 A1 | 12/2010 | Zhu et al. |
| 2011/0120754 A1 | 5/2011 | Kondo et al. |
| 2011/0210468 A1 | 9/2011 | Shannon et al. |
| 2011/0219973 A1 | 9/2011 | Gullentops et al. |
| 2011/0259223 A1 | 10/2011 | Cau et al. |
| 2012/0000379 A1 * | 1/2012 | Greener ................. B82Y 40/00 101/27 |
| 2012/0115262 A1 | 5/2012 | Menard et al. |
| 2012/0126229 A1 | 5/2012 | Bower |
| 2012/0256346 A1 | 10/2012 | Ogino et al. |
| 2012/0313241 A1 | 12/2012 | Bower |
| 2012/0321738 A1 * | 12/2012 | Ishii ................. G03F 7/038 425/385 |
| 2012/0328728 A1 | 12/2012 | Nakatsuka et al. |
| 2013/0036928 A1 | 2/2013 | Rogers et al. |
| 2013/0069275 A1 | 3/2013 | Menard et al. |
| 2013/0273695 A1 | 10/2013 | Menard et al. |
| 2013/0333094 A1 | 12/2013 | Rogers et al. |
| 2014/0084450 A1 | 3/2014 | Nielson et al. |
| 2014/0264763 A1 | 9/2014 | Meitl et al. |
| 2015/0135525 A1 | 5/2015 | Bower |
| 2016/0020131 A1 * | 1/2016 | Bower ................. B25J 15/00 294/213 |
| 2016/0020187 A1 | 1/2016 | Okada et al. |
| 2017/0103964 A1 | 4/2017 | Bower et al. |
| 2017/0133248 A1 | 5/2017 | Menard et al. |
| 2017/0133250 A1 | 5/2017 | Menard et al. |
| 2017/0173852 A1 | 6/2017 | Moore et al. |
| 2017/0207193 A1 | 7/2017 | Bower et al. |
| 2018/0001614 A1 | 1/2018 | Bower et al. |
| 2018/0286734 A1 * | 10/2018 | Meitl ................. H01L 24/06 |
| 2019/0300289 A1 | 10/2019 | Cok |
| 2020/0176286 A1 * | 6/2020 | Rotzoll ............ H01L 21/67144 |
| 2020/0177149 A1 * | 6/2020 | Trindade ................. H01L 24/73 |
| 2020/0259057 A1 * | 8/2020 | Pearson ................. H01L 23/538 |
| 2020/0335380 A1 * | 10/2020 | Radauscher ............ H01L 24/80 |
| 2020/0395316 A1 * | 12/2020 | Cok ................. H01L 23/576 |

FOREIGN PATENT DOCUMENTS

| | | |
|---|---|---|
| EP | 0281100 A2 | 9/1988 |
| EP | 0281100 B1 | 6/1992 |
| JP | H11-142878 A | 5/1999 |
| JP | 2007-27693 A | 2/2007 |
| KR | 100763493 B1 | 10/2007 |
| KR | 100787237 B1 | 12/2007 |
| KR | 100873516 B1 | 12/2008 |
| KR | 10-20110118616 A | 10/2011 |
| KR | 101240319 B1 | 3/2013 |
| KR | 101488419 B1 | 2/2015 |
| TW | 201350248 A | 12/2013 |
| WO | WO-2008/030960 A2 | 3/2008 |
| WO | WO-2008/143635 A1 | 11/2008 |
| WO | WO-2011/126726 A1 | 10/2011 |
| WO | WO-2012/121377 A1 | 9/2012 |
| WO | WO-2016/012409 A2 | 1/2016 |

OTHER PUBLICATIONS

Bower, C. A. et al., Emissive displays with transfer-printed assemblies of 8 μm ×15 μm inorganic light-emitting diodes, Photonics Research, 5(2):A23-A29, (2017).

Bower, C. A. et al., Micro-Transfer-Printing: Heterogeneous Integration of Microscale Semiconductor Devises using Elastomer Stamps, IEEE Conference, (2014).

(56) References Cited

OTHER PUBLICATIONS

Bower, C. A. et al., Transfer Printing: An Approach for Massively Parallel Assembly of Microscale Devices, IEE, Electronic Components and Technology Conference, 2008, pp. 1105-1109.

Cok, R. S. et al., 60.3: AMOLED Displays Using Transfer-Printed Integrated Circuits, Society for Information Display, 10:902-904, (2010).

Cok, R. S. et al., AMOLED displays with transfer-printed integrated circuits, Journal of SID, 19(4):335-341, (2011).

Cok, R. S. et al., Inorganic light-emitting diode displays using micro-transfer printing, Journal of the SID, 25(10):589-609, (2017).

Feng, X. et al., Competing Fracture in Kinetically Controlled Transfer Printing, Langmuir, 23(25):12555-12560, (2007).

Hamer et al., 63.2: AMOLED Displays Using Transfer-Printed Integrated Circuits, SID 09 Digest, 40(2):947-950 (2009).

Huang, Y. Y. et al., Stamp Collapse in Soft Lithography, Langmuir, 21(17):8058-8068, (2005).

Hui, C. Y. et al., Constraints on Microcontact Printing Imposed by Stamp Deformation, Langmuir, 18:1394-1407 (2002).

Kim, S. et al., Microstructural elastomeric surfaces with reversible adhesion and examples of their use in deterministic assembly by transfer printing, PNAS, 107(40):17095-17100 (2010).

Kim, T. et al., Kinetically controlled, adhesiveless transfer printing using microstructured stamps, Applied Physics Letters, 94(11):113502-1-113502-3, (2009).

Meitl, M. A. et al., Transfer printing by kinetic control of adhesion to an elastomeric stamp, Nature Material, 5:33-38, (2006).

Michel, B. et al., Printing meets lithography: Soft approaches to high-resolution patterning, J. Res. & Dev. 45(5):697-708, (2001).

Trindade, A.J. et al., Precision transfer printing of ultra-thin AlInGaN micron-size light-emitting diodes, Crown, pp. 217-218, (2012).

Wu-Bavouzet, F. et al., Effect of surface pattern on the adhesive friction of elastomers, Physical Review E, 82(3):031806-1-031806-9 (2010).

Yu, J. and Bulovic, V., Micropatterning metal electrode of organic light emitting devices using rapid polydimethylsiloxane lift-off, Applied Physics Letters, 91:043102-1-043102-3 (2007).

Zhou, W. et al., Mechanism for stamp collapse in soft lithography, Applied Physics Letters, 87:251925-1 (2005).

* cited by examiner

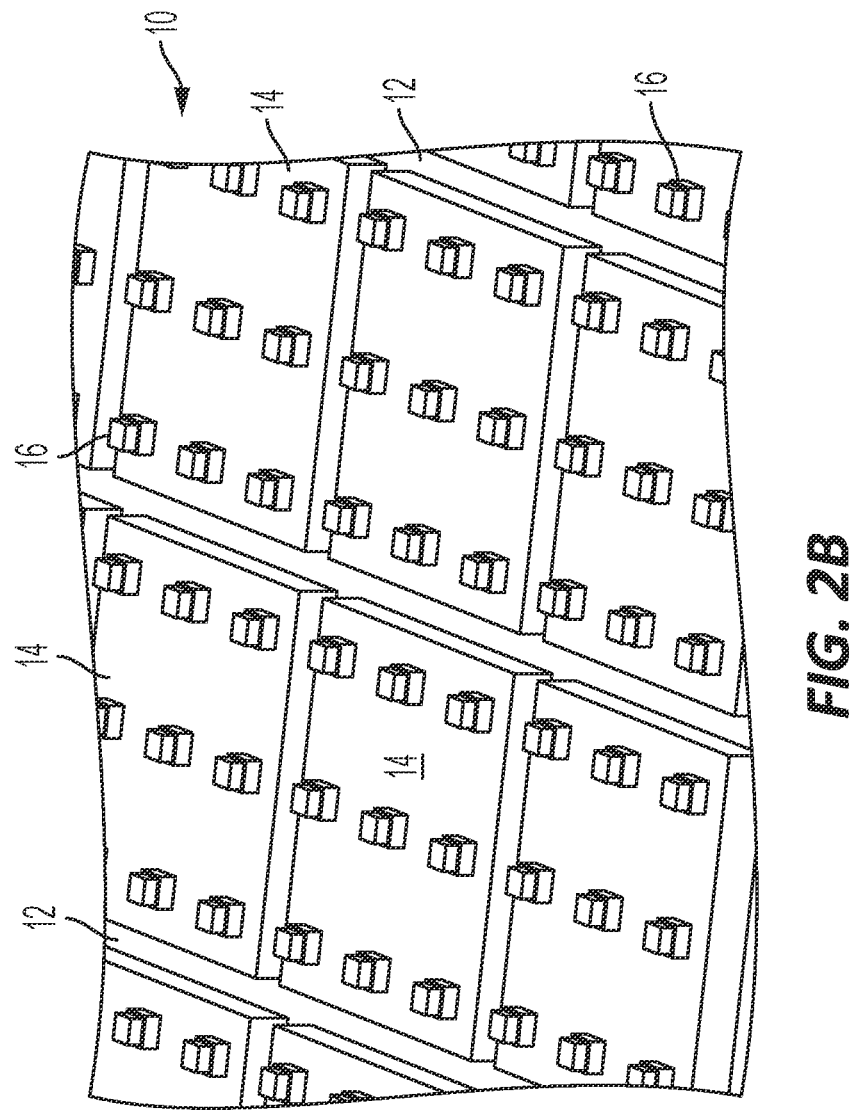

TRANSFER STAMPS WITH MULTIPLE SEPARATE PEDESTALS

CROSS REFERENCE TO RELATED APPLICATIONS

This application is related to U.S. patent application Ser. No. 14/804,031 filed Jul. 20, 2015, entitled Apparatus and Methods for Micro-Transfer-Printing, to U.S. Pat. No. 9,704,821 filed Oct. 20, 2015, entitled Stamp with Structured Posts, and to U.S. patent application Ser. No. 14/975,041 filed Dec. 18, 2015, entitled Multi-Layer Stamp, which are hereby incorporated by reference in their entirety.

TECHNICAL FIELD

The present disclosure relates to stamps used in micro-transfer printing.

BACKGROUND

Conventional methods for applying integrated circuits to a destination substrate, such as pick-and-place, are limited to relatively large devices, for example having a dimension of a millimeter or more. It is often difficult to pick up and place ultra-thin, fragile, or small devices using such conventional technologies. More recently, micro-transfer printing methods have been developed that permit the selection and application of these ultra-thin, fragile, or small devices without causing damage to the devices themselves.

Micro-transfer-printing enables deterministically removing arrays of micro-scale, high-performance devices from a native source wafer, typically a semiconductor wafer on which the devices are constructed and assembling and integrating the devices onto non-native destination substrates. Embodiments of micro-transfer-printing processes leverage engineered elastomer stamps coupled with high-precision motion-controlled print-heads to selectively pick-up and print large arrays of micro-scale devices from a source native wafer onto non-native destination substrates.

Adhesion between an elastomeric transfer device and a printable element can be selectively tuned by varying the speed of the print-head. This rate-dependent adhesion is a consequence of the viscoelastic nature of the elastomer used to construct the transfer device. When the transfer device is moved quickly away from a bonded interface, the adhesion is large enough to "pick" the printable elements away from their native substrates, and conversely, when the transfer device is moved slowly away from a bonded interface the adhesion is low enough to "let go" or "print" the element onto a foreign surface. This process may be performed in massively parallel operations in which the stamps can transfer, for example, hundreds to thousands of discrete structures in a single pick-up and print operation.

Micro-transfer printing enables parallel assembly of high-performance semiconductor devices onto virtually any substrate material, including glass, plastics, metals, or semiconductors. The substrates may be flexible, thereby permitting the production of flexible electronic devices. Flexible substrates may be integrated in a large number of configurations, including configurations not possible with brittle silicon-based electronic devices. Additionally, plastic substrates, for example, are mechanically rugged and may be used to provide electronic devices that are less susceptible to damage or electronic performance degradation caused by mechanical stress. Thus, these materials may be used to fabricate electronic devices by continuous, high-speed, printing techniques capable of generating electronic devices over large substrate areas at low cost (e.g., roll-to-roll manufacturing).

Moreover, micro-transfer printing techniques can print semiconductor devices at temperatures compatible with assembly on plastic polymer substrates. In addition, semiconductor materials may be printed onto large areas of substrates thereby enabling continuous, high-speed printing of complex integrated electrical circuits over large substrate areas. Fully flexible electronic devices with good electronic performance in flexed or deformed device orientations can be provided to enable a wide range of flexible electronic devices.

Micro-structured stamps may be used to pick up micro-devices from a source substrate, transport the micro-devices to the destination, and print the micro-devices onto a destination substrate. The transfer device (e.g., micro-structured stamp) can be made using various materials. Posts on the transfer device can be constructed to pick up material from a pick-able object and then print the material to the target substrate. The posts can be generated in an array fashion and can have a range of heights depending on the size of the printable material. Embodiments of micro-transfer printing stamps are described, for example, in U.S. Patent Publication Nos. 2010/0123268, 2009/0199960, 2013/0069275 and U.S. Pat. Nos. 7,195,733 and 9,704,821.

For effective, high-yield printing, when picking up the material it is important that stamp posts are in close contact and are spatially aligned with the material (e.g., micro integrated circuits) being transferred or printed. A stamp designed for picking up devices from a source substrate must have posts located in close correspondence with devices over the extent of the source substrate. Such a close alignment in location between stamp posts and source substrate devices can be difficult when the stamps and source substrates are both relatively large.

There is a need, therefore, for stamps having an improved accuracy in picking up and transferring material over the extent of a source substrate and a destination substrate.

SUMMARY

The present disclosure provides, inter alia, structures and methods that enable micro-transfer printing for micro-devices provided on a source substrate. The micro-devices are formed on the source substrate, contacted by a stamp to adhere the micro-devices to the stamp and release them from the source substrate, and pressed against a destination (or target) substrate to adhere the micro-devices to the destination substrate. The stamp is then moved away from the destination substrate, leaving the micro-devices on the destination substrate.

The present disclosure provides, among other things, stamps used for micro-transfer printing that have a reduced susceptibility to changes in temperature. Materials used in micro-transfer printing stamps can comprise materials with a relatively high coefficient of thermal expansion (CTE) that is greater than the coefficient of thermal expansion for source substrates from which a stamp is intended to pick up devices or for destination substrates onto which the stamp is intended to print devices. An example of such a material is polydimethylsiloxane (PDMS). Moreover, a stamp typically includes a rigid support having a relatively lower CTE and a body from which a post (sometimes called a pillar) extends having a relatively greater CTE. Each post is used to contact a single micro-device or micro-structure and each micro-device is contacted by a single post to perform a release and print of the micro-device from a source wafer to a destination wafer.

The construction process for a stamp typically requires temperatures greater than an operating temperature for the device. Moreover, as the ambient operating temperature of the stamp, source substrate, and destination substrates changes, the alignment of the stamp posts to devices on the source substrate or print locations on the destination substrate can likewise change due to the differences in material CTE between the rigid substrate, body, stamp posts, source substrate, and destination substrate, reducing the accuracy or yield of the print process.

According to certain embodiments of the present disclosure, such problems are addressed with a stamp for micro-transfer printing that comprises a rigid support having a support coefficient of thermal expansion (support CTE) and pedestals disposed on (e.g., disposed directly on and in contact with) the rigid support. Each of the pedestals is spatially separated from any other of the pedestals and the pedestals have a pedestal coefficient of thermal expansion (pedestal CTE) that is greater than the support CTE. Posts are disposed on (e.g., directly on and in contact with) each of the pedestals. Each post has a post coefficient of thermal expansion (post CTE) that is greater than the support CTE.

In some embodiments, the posts and the pedestal comprise a same material. In some embodiments, the post CTE is greater than the pedestal CTE. In some embodiments, the pedestals are disposed in a regular array or in an irregular arrangement. In some embodiments, the posts disposed on each of the pedestals comprises two or more posts disposed in a regular array on the pedestal. In some embodiments, the posts disposed on (e.g., directly on and in contact with) each of the pedestals are collectively disposed in a regular array over the rigid support. In some embodiments, the stamp comprises a viscoelastic stamp material.

According to some embodiments of the present disclosure, the rigid support has a dimension (e.g., diameter) no less than 25 mm (e.g., no less than 51 mm, no less than 76 mm, no less than 10 mm, no less than 150 mm, no less than 200 mm, no less than 300 mm, no less than 450 mm, or no greater than 675 mm). In some embodiments, the one or more posts have a length no greater than 200 µm (e.g., no greater than 100 µm, no greater than 50 µm, no greater than 20 µm, no greater than 10 µm, no greater than 5 µm, no greater than 3 µm, no greater than 2 µm, no greater than 1 µm, or greater than or equal to 500 nm).

In some embodiments, the pedestals each comprise polydimethylsiloxane (PDMS) formed from a mixture having a ratio of elastomer to curing agent in a range of 2:1 to 7:1. In some embodiments, the posts each comprise polydimethylsiloxane formed from a mixture having a ratio of elastomer to curing agent in a range of 7:1 to 14:1. In some embodiments, both the pedestals and the posts have a ratio of elastomer to curing agent of about 10:1 (e.g., varying no more than 10% from a ratio of 10:1). In some embodiments, the pedestals have a ratio of elastomer to curing agent of about 5:1 (e.g., varying no more than 10% from a ratio of 5:1) and the posts have a ratio of elastomer to curing agent of about 10:1 (e.g., varying no more than 10% from a ratio of 10:1).

According to some embodiments, the pedestals are spaced such that a maximum spacing between adjacent ones of the pedestals is less than a minimum extent of any of the pedestals over the rigid support. Each of the pedestals can have an extent over the rigid support that is no more than 25% larger than the area defined by a convex hull enclosing the posts disposed (e.g., directly) on the pedestal. The pedestals and the posts can each or both have a substantially rectangular or trapezoidal cross section in a direction parallel to a surface of the rigid support or in a direction orthogonal to a surface of the rigid support on which the pedestals are disposed. The posts can be tiered posts having a bottom portion in direct contact with the pedestal and a top portion in direct contact with the bottom portion and the top portion can have a greater CTE than a CTE of the bottom portion.

According to some embodiments of the present disclosure, a micro-transfer printing system comprises a stamp comprising spatially separated pedestals each having posts extending therefrom, a source substrate comprising devices disposed in an arrangement corresponding to an arrangement of one or more stamp posts disposed directly on and in contact with each of the pedestals, a destination substrate, and a motion-control platform for controlling the stamp to contact the posts to the devices, remove the devices from the source substrate, and contact the devices to the destination substrate. An adhesive layer can be disposed on the destination substrate. The source substrate can have a diameter no less than 25 mm (e.g., no less than 51 mm, no less than 76 mm, no less than 10 mm, no less than 150 mm, no less than 200 mm, no less than 300 mm, no less than 450 mm, or no greater than 675 mm). In some embodiments, the stamp comprises stamp material that has a cure temperature and the motion-control platform has an operating temperature different from the cure temperature.

According to some embodiments of the present disclosure, a method of micro-transfer printing comprises providing the micro-transfer printing system and using the motion-control platform at an operating temperature to (i) contact the posts of each of the pedestals to the devices, (ii) remove the devices from the source substrate, and (iii) contact the devices to the destination substrate. The motion-control platform can be used at the operating temperature to separate the stamp from the destination substrate leaving the devices disposed on the destination substrate and the stamp can comprise stamp material that has a cure temperature different from the operating temperature.

According to some embodiments of the present disclosure, a method of making a stamp for micro-transfer printing comprises providing a mold defining spatially separated pedestals and one or more posts disposed on and in direct contact with each pedestal that extend away from the pedestal, providing a rigid support in or in contact with the mold, the rigid support having a support coefficient of thermal expansion (CTE), providing curable stamp material in the mold, curing the curable stamp material at a cure temperature to form cured stamp material, the cured stamp material having a stamp material CTE that is greater than the support CTE, and cooling the rigid support and cured stamp material to an operating temperature different from the cure temperature. In some embodiments, methods of the present disclosure comprise removing the mold to provide a stamp for micro-transfer printing. The stamp can comprise pedestals disposed on (e.g., directly on and in contact with) the rigid support and posts disposed on (e.g., directly on and in contact with) each of the pedestals so that each of the pedestals is disposed between one or more disposed posts and the rigid support. The pedestals can be disposed in a regular array over the rigid support and the posts extending away from each of the pedestals can be collectively disposed in a regular array over the rigid support.

Embodiments of the present disclosure provide stamps with improved print yields and accuracy.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 2A-2C are illustrations representing micrographs of constructed embodiments of the present disclosure;

Figure 1A:
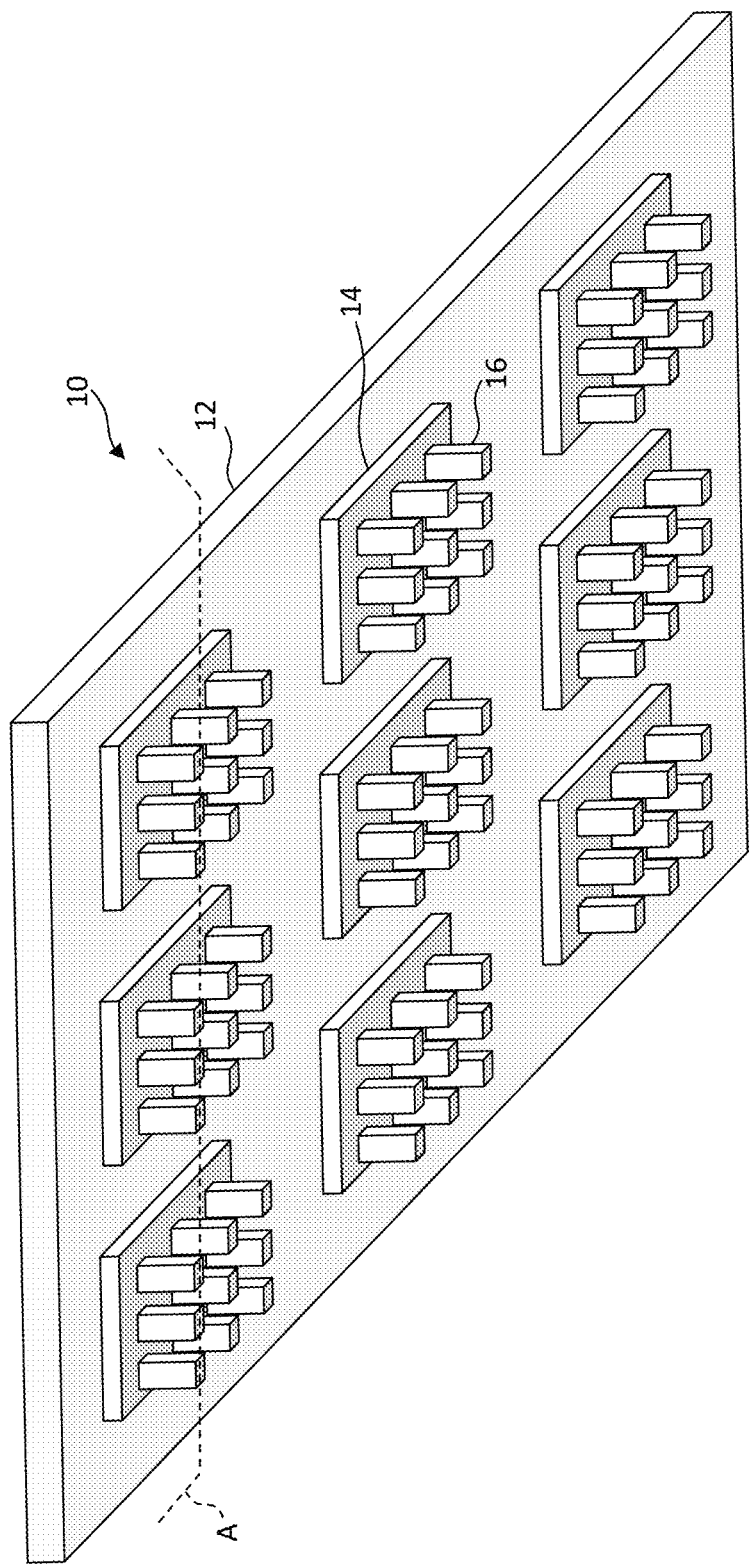
FIG. 1A is a perspective.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, or structurally similar elements. The figures are not drawn to scale since the variation in size of various elements in the Figures is too great to permit depiction to scale.

DETAILED DESCRIPTION OF CERTAIN EMBODIMENTS

Figure 5:
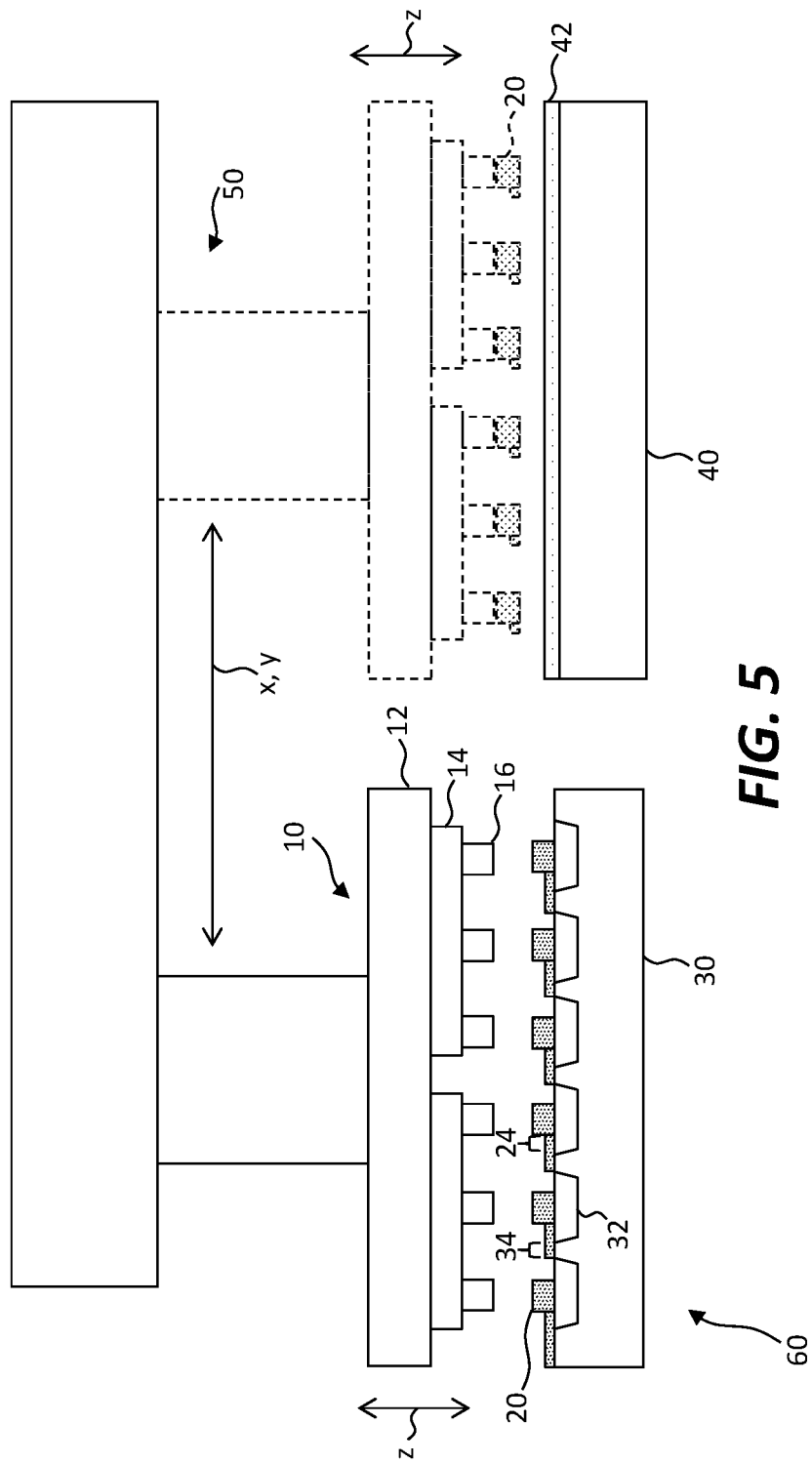
FIG. 5 is a schematic cross section illustrating a micro-transfer printing system according to embodiments of the present invention.

The present disclosure provides structures and methods that facilitate micro-transfer printing of micro-devices 20 on a source substrate 30 (e.g., as shown in FIG. 5), especially substrates such with an extensive surface as a wafer, for example having a dimension (for example a diameter) greater than or equal to 10 mm and, optionally, no more than 675 mm (e.g., a 2-inch, 4-inch, 8-inch, or 12-inch wafer). Micro-devices 20 are formed on a source substrate 30 (source wafer 30), each micro-device 20 is contacted by a different post 16 of a stamp 10 under the control of a motion-control platform 50 to release micro-devices 20 from source substrate 30 and adhere micro-devices 20 to posts 16 of stamp 10, and micro-devices 20 are pressed against a destination substrate 40 to adhere micro-devices 20 to destination substrate 40, forming a micro-transfer printed system. Stamp 10 is then moved away from destination substrate 40, leaving micro-devices 20 on destination substrate 40. Different stamp steps can be applied to micro-devices 20 from different source wafers 30, for example thereby forming a heterogeneous micro-system on destination substrate 40 comprising a variety of different micro-devices 20 constructed in different materials, for example silicon and various compound semiconductors such as GaN or GaAs.

Micro-transfer printable micro-devices 20 can have, for example, one or more of a width from 1-8 μm, a length from 5-10 μm, or a height from 0.5-3 μm. More generally, micro-transfer printable micro-devices 20 can comprise or be a variety of chiplets 20 comprising conductor or semiconductor structures, including, but not limited to, a diode, a light-emitting diode (LED), a transistor, a laser, an integrated circuit, active electrical components, passive electrical components, or an electrical jumper.

Micro-transfer printing enables printed structures with low-cost, high-performance heterogeneous arrays of electrically connected micro-devices 20 such as integrated circuits, photonic elements such as lasers, sensor, or light pipes, or micro-light-emitting diodes (LEDs) useful, for example, in display or photonic systems. Micro-transfer printable micro-devices 20 can be light emitters or integrated circuits, for example CMOS integrated circuits made on or in a silicon source substrate 30, light-emitting diodes (LEDs) or lasers, for example made on or in a GaN, GaAs, or InP compound semiconductor wafer, or silicon photodiodes. For example, described herein are micro-assembled heterogeneous arrays of micro-devices 20, such as integrated circuits, lasers, or micro-LEDs, that are too small, numerous, or fragile to be assembled by conventional means. Rather, these arrays are assembled using micro-transfer printing technology.

Micro-devices 20 may be prepared on a native source substrate 30 and printed to a destination substrate 40 (e.g., plastic, metal, glass, ceramic, sapphire, transparent materials, opaque materials, rigid materials, or flexible materials), thereby obviating the manufacture of micro-devices 20 on destination substrate 40. Source wafers 30 can have a diameter no less than 25 mm (e.g., no less than 51 mm, no less than 76 mm, no less than 10 mm, no less than 150 mm, no less than 200 mm, no less than 300 mm, no less than 450 mm, or no less than 675 mm).

Chiplets 20 are small integrated circuits. Chiplets 20 can be unpackaged dies released from a source wafer 30, and can be micro-transfer printed and incorporate a broken (e.g., fractured) or separated tether 24. Chiplets 20 can have at least one of a width, a length, and a height of, for example, from 2 μm to 1 mm (e.g., 2 to 5 μm, 5 to 10 μm, 10 to 20 μm, 20 to 50 μm, 50 μm to 100 μm, 100 μm to 250 μm, 250 μm to 500 μm, or 500 μm to 1000 μm). Chiplets 20 can, for example, have a doped or undoped semiconductor substrate thickness of 2 to 5 μm, 5 to 10 μm, 10 to 20 μm, or 20 to 50 μm. Chiplets 20 or micro-transfer printable micro-devices 20 can have a length greater than width, for example having an aspect ratio greater than or equal to 2, 4, 8, 10, 20, or 50 and component contact pads that are adjacent to the ends of micro-transfer-printable micro-devices 20 along the length of micro-transfer-printable micro-devices 20.

In certain embodiments, formation of a printable micro-device 20 begins while the semiconductor structure remains on a substrate, such as a sapphire substrate. After partially forming printable micro-device 20, a handle substrate is attached to the system opposite the substrate such that the system is secured to the handle substrate. The substrate, such as the sapphire substrate, may then be removed from the system using various techniques, such as laser ablation, grinding, etching, and polishing. After the substrate is removed, formation of the semiconductor structure is completed to form printable micro-device 20. Upon completion, printable micro-device 20 may be micro-transfer printed to a destination substrate 40, thereby enabling parallel assembly of high-performance semiconductor devices (e.g., to form micro-LED displays or photonic systems) onto virtually any substrate material, including glass, plastics, metals, other semiconductor materials, or other non-semiconductor materials.

Micro-structured stamps 10 (e.g., elastomeric, electrostatic stamps, or hybrid elastomeric/electrostatic stamps) can be used to pick up the disclosed micro-devices 20, transport micro-devices 20 to a destination, and print micro-devices 20 onto a destination substrate 40. In some embodiments, surface adhesion forces are used to control the selection and printing of these micro-devices 20 onto destination substrate 40. This process may be performed massively in parallel. Stamps 10 can be designed to transfer a single device or hundreds to thousands of discrete structures in a single pick-up and print operation. For a discussion of micro-transfer printing generally, see U.S. Pat. Nos. 7,622,367 and 8,506,867, each of which is hereby incorporated by reference in its entirety.

Moreover, these micro-transfer printing techniques can be used to print semiconductor devices at temperatures compatible with assembly on plastic polymer substrates (e.g., destination substrates 40). In addition, semiconductor materials may be printed onto large areas of destination substrates 40 thereby enabling continuous, high-speed printing of complex integrated electrical circuits over large substrate areas.

A stamp 10 can be used to micro-transfer print micro-devices 20. Referring to the perspective of FIG. 1A, the plan view of FIG. 1B, and the cross section of FIG. 1C corresponding to the cross section line A of FIGS. 1A and 1B, according to some embodiments of the present disclosure a stamp 10 for micro-transfer printing comprises a rigid support 12 having a support stiffness and a support coefficient of thermal expansion (support CTE). Pedestals 14 are formed in a pedestal layer 15 on rigid support 12. Pedestals 14 each have a pedestal stiffness that is less than the support stiffness and a pedestal coefficient of thermal expansion (pedestal CTE) that is greater than the support CTE. Posts 16 are disposed in a post layer 17 directly on and in contact with each pedestal 14 in pedestal layer 15. Each post 16 in post layer 17 has a post coefficient of thermal expansion (post CTE) that is greater than the support CTE. The CTEs can be either linear CTEs or volumetric CTEs.

Figure 1B:
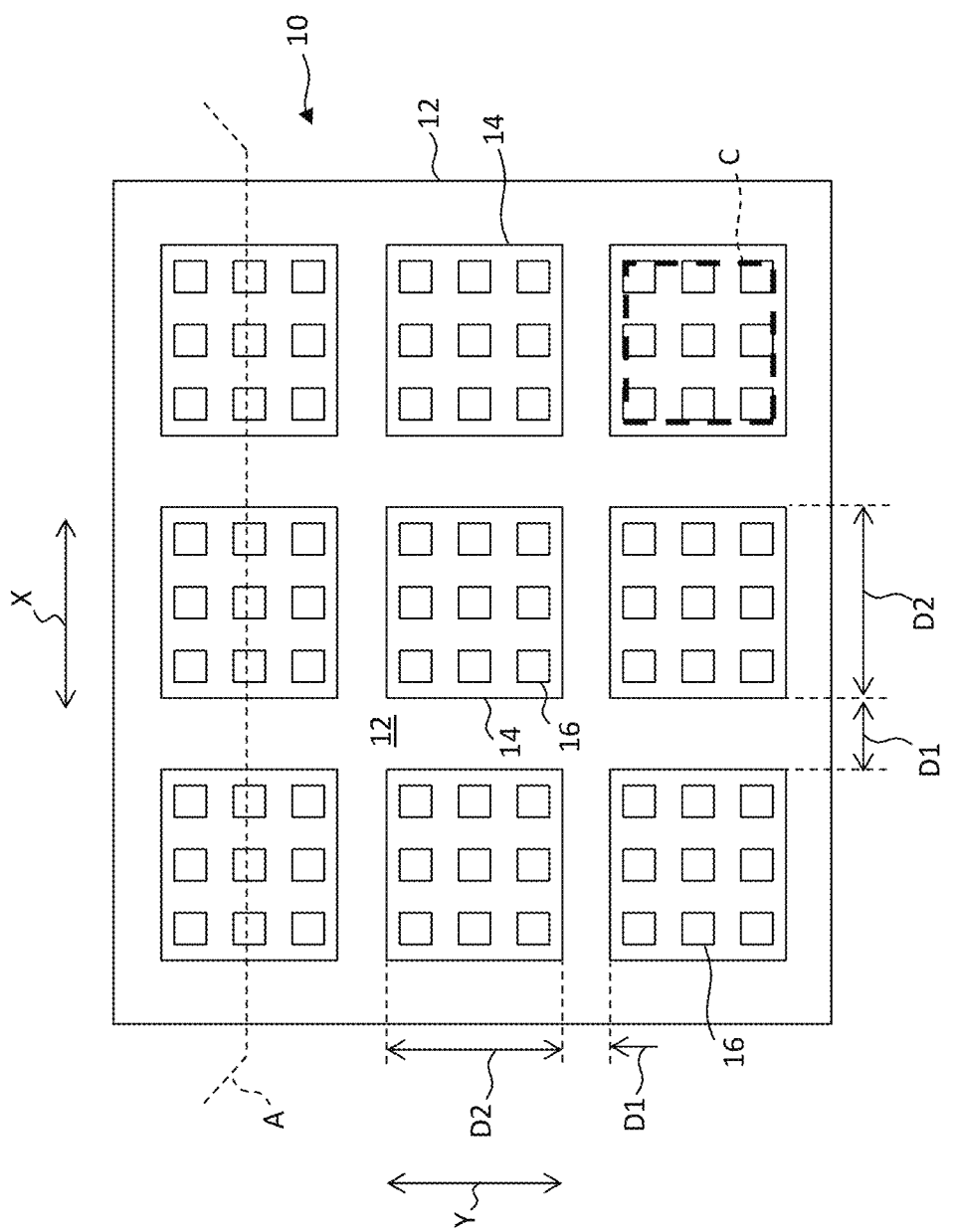
FIG. 1B is a plan view.
Figure 1C:
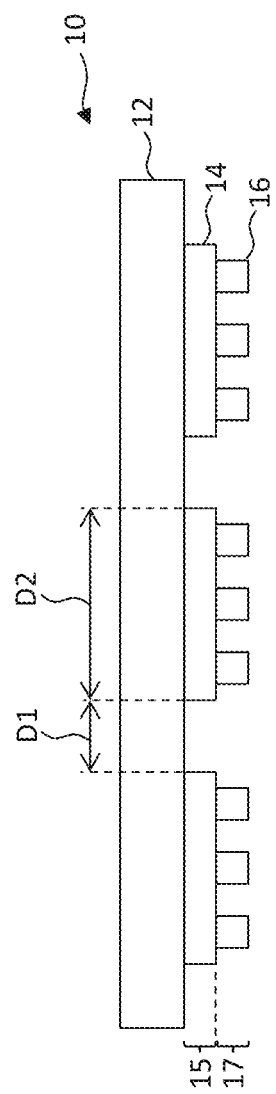
FIG. 1C is a cross section taken along cross section line A of FIGS. 1A and 1B illustrating micro-transfer printing stamps of the present disclosure.

Each of pedestals 14 is spatially separated from any other pedestal 14, so that pedestals 14 are physically separated and are not in contact with each other, e.g., separated by a distance D1 in either an x or y dimension, or both, parallel to a rigid support 12 surface, as shown in FIGS. 1B and 1C. A maximum pedestal 14 separation distance D1 can be less than a minimum extent (distance D2) of pedestal 14 in the same direction over rigid support 12 so that pedestals 14 are relatively closely spaced. Each of pedestals 14 can have an extent D2 over rigid support 12 that is no more than 50% (e.g., no more than 25%) larger than the area defined by a convex hull C enclosing the one or more posts 16 disposed directly on pedestal 14 (shown in FIG. 1B). In some embodiments, D1 distance separating pedestals 14 is greater than the pedestal CTE times the extent distance D2 of pedestal 14 and, optionally, less than 5, 4, 3, or 2 times the pedestal CTE in a given X or Y dimension or direction.

Figure 2A:
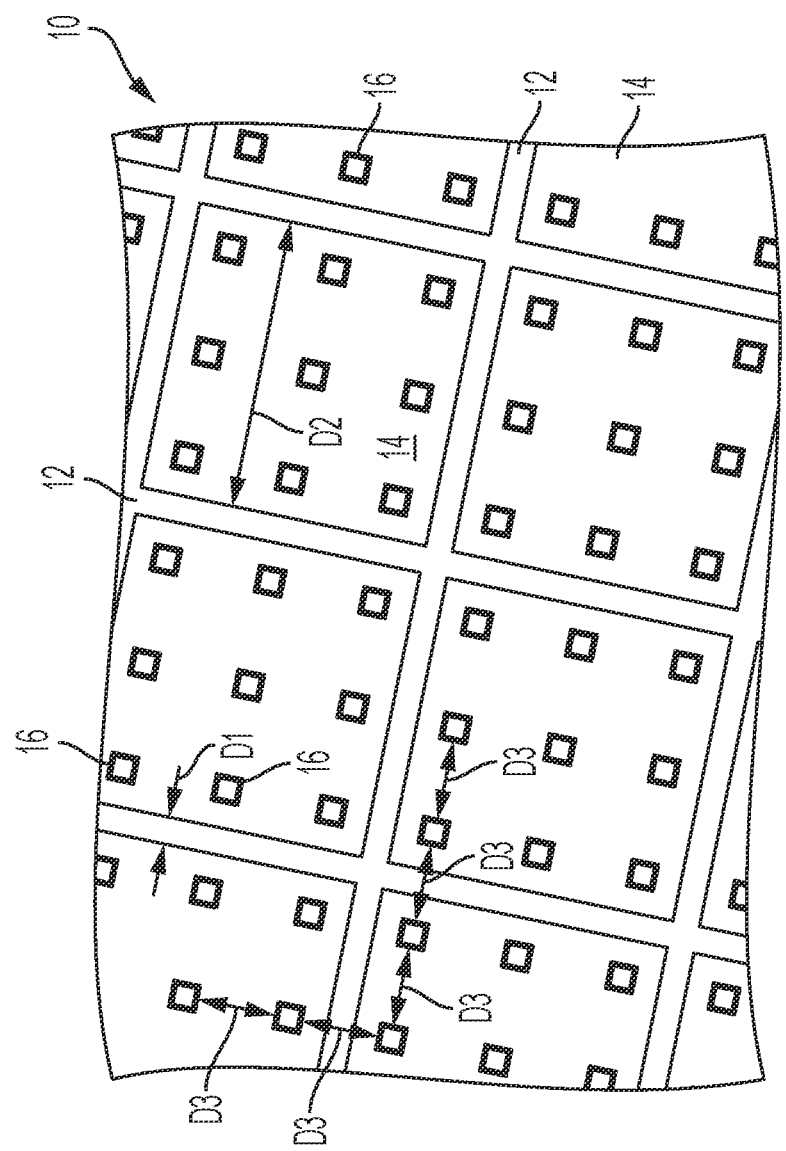
Figure 2C:
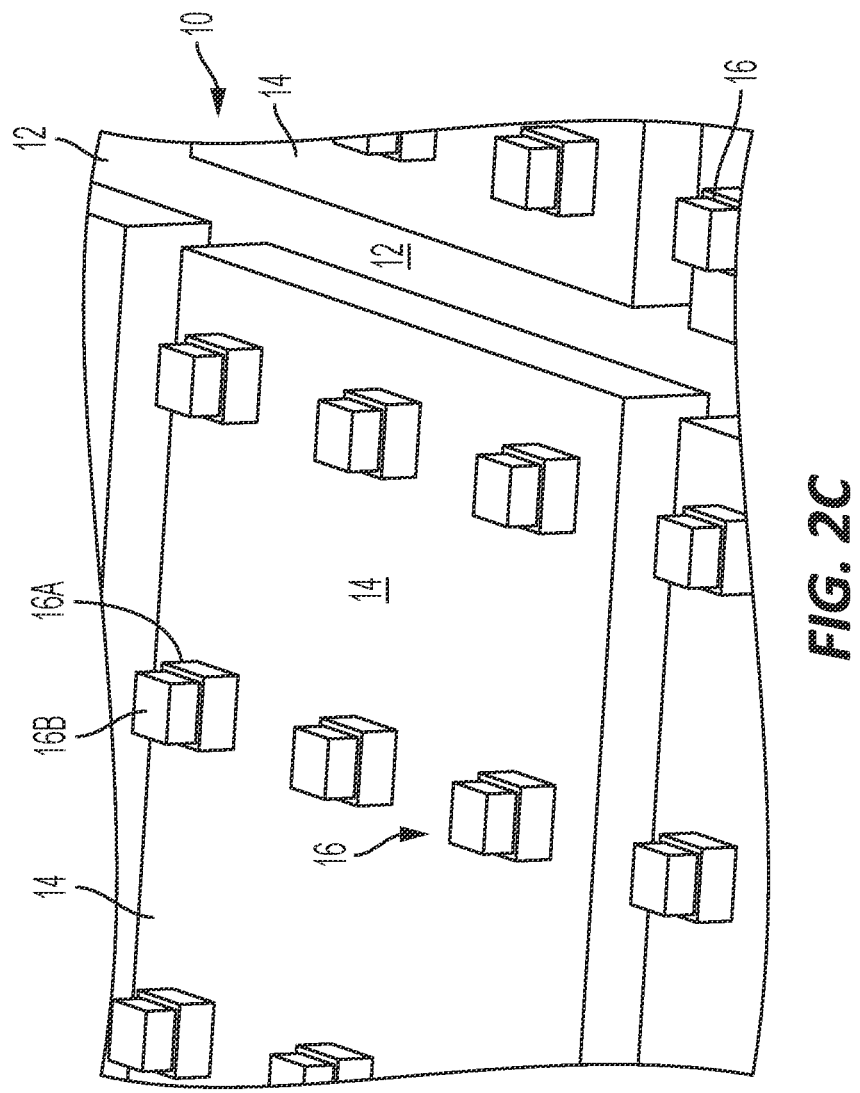
Figure 3:
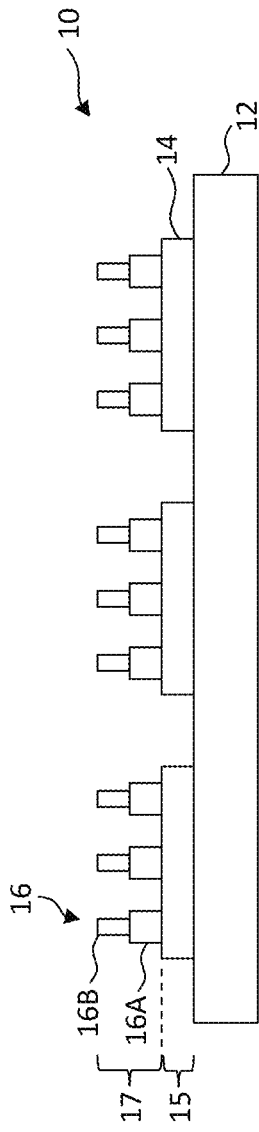
FIG. 3 is a cross section of a stamp comprising tiered posts illustrating embodiments of the present disclosure.

As shown in the illustrations of FIGS. 2A-2C, pedestals 14 can be arranged in a regular array over rigid support 12. Similarly, posts 16 on a pedestal 14 can be arranged in a regular array over rigid support 12 so that neighboring posts 16 on a pedestal 14 are separated in a direction by the same distance D3 as neighboring posts 16 on different pedestals 14 in the same direction (see FIGS. 2A-2C). In such an arrangement, the effect of temperature on stamp 10 performance can be mitigated by the use of spatially separated pedestals 14 while posts 16 can act as a single array of posts 16 to print a single regular array of micro-devices 20 (e.g., as in conventional micro-transfer printing stamps). Neighboring posts 16 are posts 16 in a direction that have no post 16 between the neighboring posts 16, for example posts 16 that are closest to each other. In some embodiments, posts 16 and pedestals 14 comprise the same material. In some embodiments, posts 16 and pedestals 14 are formed in a common step. In some embodiments, a post CTE equals a pedestal CTE. In some embodiments, posts 16 and pedestals 14 comprise different materials or comprise a same material provided with different compositions (e.g., PDMS made from different ratios of curing agent to elastomer base). In some embodiments, a post CTE is greater than a pedestal CTE. FIGS. 2A-2C are illustrations of constructed stamps 10 that have been tested and found to be effective to pick up and print micro-devices 20.

Posts 16 extend from pedestals 14 in a direction away from pedestal layer 15 and away from rigid substrate 12. Posts 16 can have an aspect ratio (height-to-width) of, for example from 1:4 to 4:1. Posts 16 can have a size that is larger or smaller than the size of a micro-device 20 (see FIG. 5) that posts 16 are designed to contact. Each post 16 is designed to contact a single different micro-device 20 so that each stamp post 16 contacts only one micro-device 20 and each micro-device 20 is contacted by only one stamp post 16. For example, posts 16 can have a length extending from pedestal 14 that is no greater than 200 μm (e.g., no greater than 100 μm, no greater than 50 μm, no greater than 20 μm, no greater than 10 μm, no greater than 5 μm, no greater than 3 μm, no greater than 2 μm, no greater than 1 μm). Additionally, posts 16 can have a shape that is the same as or different from the shape of micro-device 20 that is picked up by stamp 10. For example, in an embodiment a circular post 16 is used to pick up an 85 μm square chiplet 20. In some embodiments, for example, a 60 μm square post 16 is used to pick up an 85 μm square micro-device 20.

Figure 4:
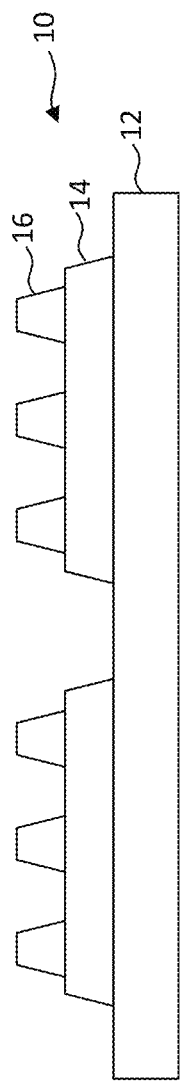
FIG. 4 is a cross section of substantially trapezoidal pedestals and posts illustrating embodiments of the present invention.

As shown in some embodiments, for example as illustrated in FIGS. 2A-2C and 3, posts 16 can be tiered posts 16 having a top portion 16B disposed on and in direct contact with a bottom portion 16A that is disposed on and in direct contact with pedestal 14. Top portion 16B can have a geometrically similar but smaller cross section than bottom portion 16A. Top portion 16B can have a height that is equal to or less than a height of bottom portion 16A. A cross section through post 16 in a plane substantially parallel to a surface of rigid support 12 can be substantially rectangular (e.g., except for slightly rounded or otherwise relieved corners). As shown in FIG. 4, a cross section through post 16 in a plane substantially perpendicular to a surface of rigid support 12 can be substantially trapezoidal (e.g., except for slightly rounded or otherwise relieved corners on a distal end of posts 16). A substantially rectangular or trapezoidal pedestal 14 or post 16 can incorporate such rounded or relieved corners. A tiered structure can enable picking up very small micro-devices 20 with high yields for relatively larger stamps 10 with more posts 16.

Pedestals 14 or posts 16 of the present disclosure can comprise or be made of conformal materials such as a visco-elastic material or an elastomer, for example polydimethylsiloxane (PDMS), an optically clear polymeric organosilicon compound. The stiffness and CTE of PDMS can be controlled by forming PDMS with different ratios of constituents. For example, Dow Sylgard 184 Elastomer Base and Curing Agent by Dow Corning Corporation of Auburn, Mich., can be mixed at a ratio from 1 part elastomer base to 1 part curing agent by weight to 50 parts elastomer base to 1 part curing agent by weight (e.g., 10 parts elastomer base to 1 part curing agent by weight) to provide PDMS with varying stiffness and CTE.

Pedestals 14 and posts 16 can be formed from a mixture having a ratio of elastomer to curing agent in a range of 1:1 to 15:1, for example made in a ratio of about 10:1 elastomer to curing agent (e.g., varying no more than 10% from a ratio of 10:1). In some embodiments, pedestals 14 are made of the same material in the same proportions as posts 16 and have the same stiffness and CTE. Alternatively, pedestals 14 include the same material as posts 16 but in different proportions or includes different materials. Using the same materials in different proportions in pedestals 14 and posts 16 enables the stiffness and CTEs of the different layers to be separately controlled. For example, in some embodiments, pedestal 14 is stiffer than posts 16 or has a smaller CTE than posts 16. Thus, in some embodiments, pedestal 14 is more rigid than posts 16 and the pedestal CTE is smaller than the post CTE. For example, pedestals 14 can be made with a ratio of 2:1 to 8:1 elastomer to curing agent, for example about 5:1, and posts 16 can be made in a ratio of 8:1 to 14:1 elastomer to curing agent, for example about 10:1. In some embodiments, bottom portion 16A has a smaller CTE than top portion 16B and a CTE greater than that of pedestals 14. For example, a pedestal 14 could be made of PDMS having an elastomer to curing agent ratio of about 5:1 (e.g., varying no more than 10% from a ratio of 5:1), bottom portion 16A of about 8:1 (e.g., varying no more than 10% from a ratio of 8:1) and a top portion 16B of about 10:1 (e.g., varying no more than 10% from a ratio of 10:1).

In some embodiments, pedestal layer 15 can have a range of thickness from 100 μm to 10 mm and post layer 17 can have a range of thickness from 0.1 mm to 10 mm (e.g., 1 mm). Stamp posts 16 can have, for example, a length ranging from 5 μm to 100 μm (e.g., 20 μm). Stamp posts 16 can have, for example, a height-to-width ratio of 1:4 to 4:1 or more. A linear pedestal CTE or linear post CTE can be from $1 \times 10^{-4}$/K to $5 \times 10^{-4}$/K (e.g., approximately $3.1 \times 10^{-4}$/K). These ranges and values are illustrative and not limiting and other materials and sizes are contemplated in the present disclosure.

According to some embodiments of the present disclosure, rigid support 12 can be or comprise glass (e.g., a portion of a flat-panel display substrate), soda-lime glass, borosilicate glass, quartz, sapphire, pyrex, metal, ceramic, polymer, a cured epoxy, or a semiconductor (e.g., a wafer or portion of a wafer). Rigid support 12 can have a thickness ranging from 0.5 mm to 10 mm. These ranges are illustrative and not limiting and other materials and sizes are contemplated in the present disclosure. The linear support CTE can be from $5 \times 10^{-6}$/K to $10 \times 10^{-6}$/K (e.g., approximately $8.5 \times 10^{-6}$/K). Rigid support 12 can be made from, for example, glass or plastic (e.g., polycarbonate (PC), poly(methyl methacrylate) (PMMA), polyethylene terephthalate (PET), or polyethylene naphthlate (PEN)). Rigid support 12 can be thicker, the same thickness as, or thinner than pedestal layer 15. Rigid support 12 can be, for example, no less than 500 microns thick (for example no less than 700 microns, 1 mm, 2 mm, 3 mm, 5 mm, or 1 cm thick).

According to some embodiments of the present disclosure, and as illustrated in the schematic of FIG. 5, a micro-transfer printing system 60 comprises a stamp 10, for example a stamp 10 in accordance with one or more of FIGS. 1A-4, a source substrate 30 comprising micro-devices 20 disposed in an arrangement corresponding to an arrangement of posts 16 of stamp 10, a destination substrate 40 (optionally coated with an adhesive layer 42), and a motion-control platform 50 for controlling stamp 10 with respect to source wafer 30 and destination substrate 40 to contact posts 16 to micro-devices 20, remove micro-devices 20 from source substrate 30, and contact micro-devices 20 to destination substrate 40 or adhesive layer 42 on destination substrate 40. FIG. 5 illustrates motion-control platform 50 with stamp 10 in relation to source substrate 30 and micro-devices 20 and suggests a location of stamp 10 and micro-devices 20 in relation to destination substrate 40 with dashed lines. The vertical arrows in FIG. 5 illustrate a movement Z in the z-direction (z dimension) of stamp 10 to pick up micro-devices 20 suspended over sacrificial portions 32 with tethers 24 attached to anchors 34 in source substrate 30 by breaking (e.g., fracturing) or separating tethers 24 to adhere micro-devices 20 to stamp posts 16 and to press micro-devices 20 on stamp posts 16 to destination substrate 40 or adhesive layer 42. The horizontal arrow illustrates an X or Y movement of stamp 10 from source wafer 30 to destination substrate 40. In some embodiments of the present disclosure, stamp 10 comprises stamp material that has a cure temperature and motion-control platform 50 has an operating temperature different from the cure temperature. Source substrate 30 can have a diameter no less than 25 mm (e.g., no less than 51 mm, no less than 76 mm, no less than 10 mm, no less than 150 mm, no less than 200 mm, no less than 300 mm, no less than 450 mm, or no greater than 675 mm) and destination substrate 40 can have a surface area on which micro-devices 20 are disposed that is smaller than, equal to, or larger than source substrate 30. Destination substrate 40 can be rectangular or have any surface shape that is the same as, or different from, source substrate 30.

Figure 6:
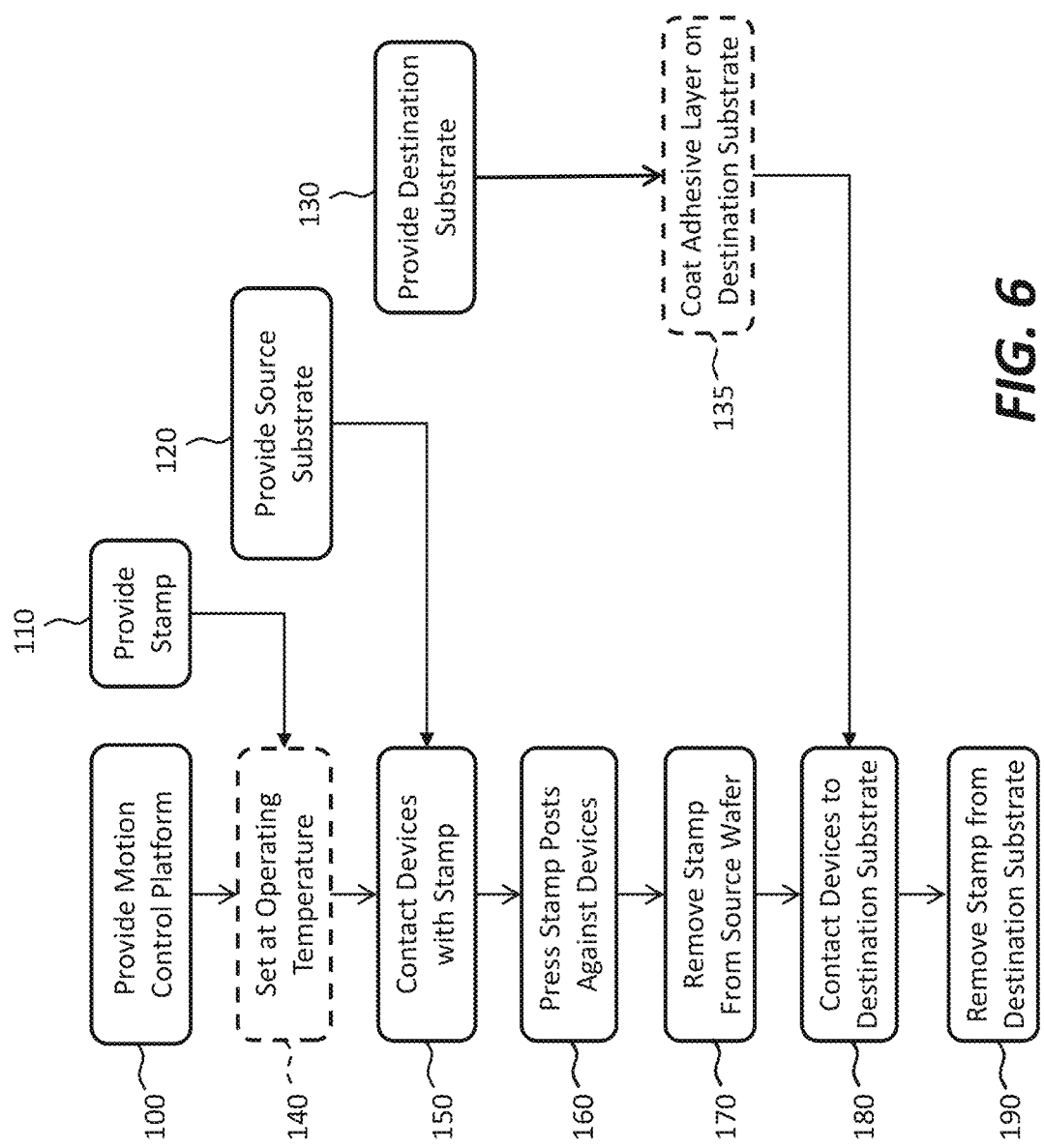
FIGS. 6 and 7 are flow diagrams illustrating embodiments of the present disclosure.

As illustrated in the flow diagram of FIG. 6, according to some embodiments of the present disclosure a method of micro-transfer printing comprises providing a micro-transfer printing system 60 that comprises providing a motion-control platform 50 in step 100, providing a stamp 10 in step 110, providing a source substrate 30 (source wafer 30) in step 120, and providing a destination (target) substrate 40 in step 130 that can be optionally coated with an adhesive in optional step 135. In optional step 140, motion-control platform 50 is operated at an operating temperature, for example less than a cure temperature for stamp 10. The operating temperature can be selected from any one or combination of a temperature of stamp 10, source substrate 30, destination substrate 40, or motion-control platform 50. Under the control of motion-control platform 50, in step 150 micro-devices 20 are contacted by stamp 10, each stamp post 16 is pressed against a different micro-device 20 to adhere micro-devices 20 to stamp posts 16 in step 160, adhered micro-devices 20 are removed from source wafer 30 in step 170, and adhered micro-devices 20 are contacted to destination substrate 40 in step 180. In step 190, motion-control platform 50 removes stamp 10 from destination substrate 40.

Figure 7:
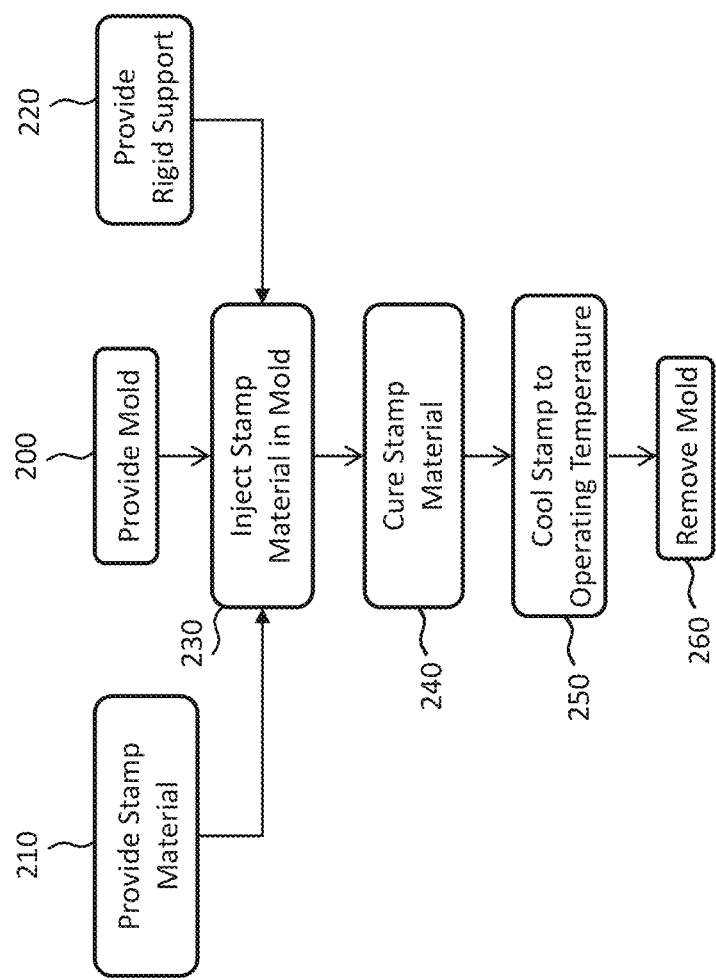

As illustrated in the flow diagram of FIG. 7, according to some embodiments of the present disclosure a method of making a stamp 10 for micro-transfer printing comprises providing a mold structure in step 200 defining spatially separated pedestal 14 cavities and post 16 cavities disposed on and in direct contact with each pedestal 14 that extend away from pedestal 14. The mold structure can provide pedestal cavities and post cavities in association with each pedestal cavity and can hold rigid support 12 in alignment with the pedestal cavities and post cavities. Stamp material is provided as a liquid curable material in step 210 and a rigid support 12 is provided in step 220; rigid support 12 is in or in contact with the mold so that the defined pedestal 14 cavities are in contact with rigid support 12. Rigid support 12 has a support coefficient of thermal expansion (CTE). In step 230, the liquid curable stamp material is injected into the mold cavities (e.g., at approximately 25 psi pressure) and the curable stamp material is cured in step 240 (for example by heat or radiation) at a cure temperature (e.g., at approximately 60° C. for approximately 240 minutes in an oven) to form cured stamp material forming spatially separated pedestals 14 on rigid support 12, each pedestal 14 supporting posts 16. The cured stamp material has a stamp material CTE that is greater than the support CTE. In some embodiments, post cavities are filled and cured to form posts 16 and subsequently pedestal cavities are filled and cured to form pedestals 14. In some embodiments, a top portion of post cavities is filled and cured separately from a bottom portion of post cavities. In step 250, stamp 10 is cooled to an operating temperature different from the cure temperature, for example by cooling the mold, and the mold is removed in step 260. In some embodiments, stamp 10 is cooled after removing stamp 10 from the mold. In some embodiments, pedestals 14 are disposed in a regular array over rigid support 12. In some embodiments, posts 16 extending away from each of pedestals 14 are collectively disposed in a regular array over rigid support 12.

Large stamp supports or substrates can have a variable thickness over extent of the support and elastomeric material layer coatings over the extent of the stamp support can likewise have a variable thickness. This variability is exacerbated by the process generally employed to make elastomeric stamps. In a typical process, a stamp support is placed in a mold structure with a mold defining the desired stamp structure shapes and locations, such as posts 16. A liquid elastomer (such as PDMS) is injected into the mold and then heated to cure the liquid and form the elastomeric layers of the stamp. The stamp is then cooled and can be used for micro-transfer printing. However, because the stamp support has a different CTE than any cured elastomer layer disposed on the stamp support, as the stamp cools, the stamp support and elastomeric layer physically shrink at different rates and in different amounts, creating stress in and distortion and dislocation of any structures made in the elastomeric layer, such as stamp posts. Because the elastomeric materials are elastic and are typically less rigid or stiff than the stamp support, the stress results primarily in deformation of the elastomeric layer. This can form crowns at the edges of the elastomeric layer and variability in the elastomeric layer thickness or distribution or shapes of structures, such as variation in the thickness of the elastomeric layer across the extent of the stamp support. This variability in the elastomeric layer produces a corresponding variability in the distance of the distal ends of any stamp posts formed in the elastomeric layer. When the stamp is used to pick up components from a flat surface such as a semiconductor substrate, some of the stamp posts will press too hard against some of the components and some of the stamp posts will not press sufficiently hard against other components or possibly will not contact the components at all, resulting in a failure to pick up and transfer the desired components in a micro-transfer printing operation.

Furthermore, the extent and location of any stamp structures (such as posts) over the extent of the stamp support can be distorted in a stamp made from a typical process. Because of the CTE mismatch, the overall size of the elastomeric layer on the stamp support is different in a cooled state than when cured in a relatively hot state. This distortion results in a different distribution of posts in the elastomeric layer over the stamp support, for example the posts can be farther apart (or closer) than is desired, resulting in run-out. For example, if the total linear distortion of a continuous elastomeric layer with respect to the stamp support measured over the length of the elastomeric layer is 10 microns and if the stamp has 100 posts equally distributed over the length of the continuous elastomeric layer, then each post is misaligned by 0.1 microns with respect to its neighbors in the linear direction. However, this misalignment is additive, so that while the first post is only misaligned by 0.1 microns from an edge of the elastomeric layer, perhaps a negligible amount, the $100^{th}$ post is misaligned by 10 microns from the opposite edge, a significant amount. A run-out of 10 microns for a conventional stamp has been measured.

These problems become increasingly problematic as the size of a stamp increases and the expansion and contraction of the different stamp layers increases due to the heating and cooling of the stamp layers during the curing process. Large stamps are desirable because greater quantities of components can be transferred in a single micro-transfer printing operation with larger stamps, reducing transfer costs. Thus, conventional stamps can be limited in their size or the number of components it can reliably pick up or transfer whereas stamps 10 according to embodiments of the present invention can be larger and provide more accurate transfer printing.

Stamp 10, structures, devices, and methods of the present disclosure provide an advantage over conventional stamp designs by reducing the impact of CTE differences between posts 16, pedestals 14, and rigid substrate 12. Because each pedestal 14 is spatially and physically separated from any other pedestal 14, there is no cumulative effect of thermal expansion due to temperature differences between pedestals 14 and rigid support 12 across the extent of rigid support 12 and pedestal layer 15. Thus, spatial misalignment between posts 16 on different pedestals 14 is not additive, unlike stamps 10 with a single pedestal 14 on which all posts 16 are disposed. Posts 16 on each pedestal 14 will be subject to local CTE mismatch over the extent of pedestal 14, but since each pedestal 14 area is relatively small compared to rigid support 12 area, the spatial run-out for posts 16 over each pedestal 14 is likewise relatively small.

In contrast to the example above, an example of a stamp 10 disclosed herein has ten pedestals 14 in a direction, each pedestal 14 having ten posts 16 in the direction, then the largest misalignment of a post 16 on any pedestal 14 is one micron (0.1 microns×10), a significant improvement over 10 microns in the example above. Thus, some embodiments of the present disclosure can decrease such run-out and improve micro-process printing and yields. It has also been observed that some embodiments of the present disclosure enable a thinner pedestal layer 15 or post layer 17 that in turn can reduce distortion, for example due to differential curing rates between elastomeric layers (e.g., pedestal layer 15 and post layer 17) and rigid support 12.

Thus, generally, an increased number of pedestals 14 on rigid support 12 improves spatial precision and accuracy of posts 16 in stamp 10. For example, each pedestal 14 can support, for example, a two-by-two array, a three-by-three array, a four-by-four array, a five-by-five array, a ten-by-ten array, a twenty-by-twenty array, a fifty-by-fifty array, or a one hundred-by one hundred array of posts 16. Although illustrated in the figures as having an equal number of posts 16 on pedestals 14 in each X and Y direction (X and Y dimension), according to some embodiments of the present disclosure a pedestal 14 can have different numbers of posts 16 in different dimensions. Moreover, according to some embodiments, different pedestals 14 can have different sizes, have different numbers of posts 16 thereon, or both. Indeed, posts 16 need not be distributed in an even, regular, or symmetrical array on pedestals 14, but can be disposed in an irregular array or arrangement on pedestals 14. Furthermore, and as noted above, the CTE mismatches between rigid support 12, pedestal 14, and posts 16 can be at least partially mitigated by providing pedestals 14 with a CTE between the CTE of rigid support 12 and the CTE of posts 16.

Certain embodiments of the present disclosure differ from conventional stamps in that multiple pedestals 14 are disposed on (e.g., directly on and in (physical) contact with) rigid support 12. Conventional stamps typically comprise a rigid support with a single unitary stamp body disposed on a rigid support. Spatially and physically separated posts extend from the single unitary stamp body in a direction opposite the rigid support. Each post is designed and intended to contact and pick up a single device from a source substrate so that each stamp post 16 contacts only one micro-transfer printable device and each micro-transfer printable device is contacted by only one stamp post. For example, U.S. Pat. No. 9,704,821 discloses a stamp 10 comprises a single unitary body 12 with protruding posts 14. U.S. Patent Publication No. 2016/0020131 discloses a stamp with a bulk portion from which posts protrude. The bulk portion is common to all of the posts in the stamp and is disposed on a rigid glass hard-plate interface. U.S. Patent Publication No. 2013/0069275 illustrates a stamp with a rigid back on which a single unitary layer of PDMS is disposed. Posts 105/205 protrude from the layer and micro-tips 111/211 protrude from the posts 105/205. All of the micro-tips 111/211 on a post 105/205 contact a single micro-device.

In some embodiments, rigid support 12 can have a roughened surface, for example provided by sand blasting, exposure to abrasives, or exposure to a plasma or other energetic particles. In some embodiments, pedestals 14 can be formed or cured separately from posts 16, for example with a different process, with different materials or material combinations, at a different rate, or at a different temperature.

In FIGS. 1A-5, differences in size, extent, and thickness are illustrated for clarity of exposition rather than accuracy. In practical applications, the relative or absolute differences in physical sizes can be larger or smaller.

A micro-transfer printable micro-device 20 can be an active component, for example including one or more active elements such as electronic transistors or diodes, light-emitting diodes, or photodiodes that produce an electrical current in response to ambient light. Alternatively, the micro-transfer printable micro-device 20 can be a passive component, for example including one or more passive elements such as resistors, capacitors, or conductors. In some embodiments, micro-transfer printable micro-device 20 is a compound micro-transfer printable device 20 that includes both active and passive elements. Micro-transfer printable micro-device 20 can be a semiconductor device having one or more semiconductor layers, such as an integrated circuit or chiplet 20. Micro-transfer printable micro-device 20 can be an unpackaged die. In some embodiments, micro-transfer printable micro-device 20 is a compound element having a plurality of active or passive elements, such as multiple semiconductor devices with separate substrates, each with one or more active elements or passive elements, or both. In certain embodiments, the plurality of elements is disposed and interconnected on a compound element substrate separate from the substrates of any semiconductor devices or a different substrate. The compound element can be a micro-device 20 and can be micro-transfer printed itself after the elements have been arranged and interconnected thereon. The micro-transfer printable micro-device 20 can be electronic processors, controllers, drivers, light-emitting diodes, photodiodes, light-control devices, or light-management devices.

The micro-transfer printable micro-devices 20 can include active elements such as electronic circuits formed using lithographic processes and can include passive elements such as electrical connections, e.g., wires. In some embodiments, micro-transfer printable micro-devices 20 are small integrated circuits, for example chiplets 20, having a thin substrate with a thickness of only a few microns, for example less than or equal to 25 microns, less than or equal to 15 microns, or less than or equal to 10 microns, and a width or length of 5-10 microns, 10-50 microns, 50-100 microns, or 100-1000 microns. Such chiplet 20 printable component structures can be made in a semiconductor source wafer 30 (e.g., a silicon or GaN wafer) having a process side and a back side used to handle and transport source wafer 30. Micro-transfer printable micro-devices 20 are formed using lithographic processes in an active layer on or in the process side of source wafer 30. An empty release layer space (e.g., sacrificial portion 32) is formed beneath the micro-transfer printable micro-devices 20 with tethers 24 connecting the micro-transfer printable micro-devices 20 to source wafer 30 in such a way that pressure applied against micro-transfer printable micro-devices 20 breaks (e.g., fractures) or separates tethers 24 to release micro-transfer printable micro-device 20 from source wafer 30 (e.g., with stamp 10). Methods of forming such structures are described, for example, in Cok et al., "AMOLED Displays using Transfer-Printed Integrated Circuits," Society for Information Display, Vol. 40, Issue 1, pp. 947-950, and U.S. Pat. No. 8,889,485, entitled Methods of Surface Attachment of Flipped Active Components, issued Nov. 18, 2014.

According to various embodiments, a native source wafer 30 can be provided with micro-transfer printable micro-devices 20, release layer (e.g., sacrificial portion 32), and tethers 24 already formed, or they can be constructed as part of a process of the present disclosure.

Source wafer 30 and micro-transfer printable micro-device 20, stamp 10, motion-control platform 50, and destination substrate 40 can be made separately and at different times or in different temporal orders or locations and provided in various process states.

Methods, in some embodiments, can be iteratively applied to a single or multiple destination substrates 40. By repeatedly transferring sub-arrays of micro-transfer printable micro-device 20 from a source wafer 30 to a destination substrate 40 with a stamp 10 and relatively moving the stamp 10 and destination substrate 40 between stamping operations by a distance equal to the spacing of the selected micro-transfer printable devices in the transferred sub-array between each transfer of micro-transfer printable micro-device 20, an array of micro-transfer printable micro-device 20 formed at a high density on a source wafer 30 can be transferred to a destination substrate 40 at a much lower density. In practice, source wafer 30 is likely to be expensive, and forming micro-transfer printable micro-device 20 with a high density on source wafer 30 will reduce the cost of micro-transfer printable micro-devices 20, especially as compared to forming components on destination substrate 40. Transferring micro-transfer printable micro-device 20 to a lower-density destination substrate 40 can be used, for example, if micro-transfer printable micro-devices 20 manage elements distributed over destination substrate 40, for example in a display, digital radiographic plate, or photovoltaic system.

In particular, in the case wherein active micro-transfer printable micro-device 20 is an integrated circuit formed in a crystalline semiconductor material, the integrated circuit substrate provides sufficient cohesion, strength, and flexibility that it can adhere to destination substrate 40 without breaking as transfer stamp 10 is removed.

In comparison to thin-film manufacturing methods, using densely populated source substrate wafers 30 and transferring micro-transfer printable micro-devices 20 to a destination substrate 40 that requires only a sparse array of micro-transfer printable micro-devices 20 located thereon does not waste or require active layer material on a destination substrate 40. The present invention can also be used in transferring micro-transfer printable micro-device 20 made with crystalline semiconductor materials that have higher performance than thin-film active components. Furthermore, the flatness, smoothness, chemical stability, and heat stability requirements for a destination substrate 40 used in certain embodiments of the present disclosure may be reduced because the adhesion and transfer process is not substantially limited by the material properties of the destination substrate 40. Manufacturing and material costs may be reduced because of high utilization rates of more expensive materials (e.g., the source substrate 30) and reduced material and processing requirements for destination substrate 40.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosed technology that consist essentially of, or consist of, the recited components, and that there are processes and methods according to the disclosed technology that consist essentially of, or consist of, the recited processing steps.

It should be understood that the order of steps or order for performing certain action is immaterial so long as operability is maintained. Moreover, two or more steps or actions in some circumstances can be conducted simultaneously.

PARTS LIST

A cross section line
C convex hull
D1 distance
D2 distance
D3 distance
X x dimension/x direction
Y y dimension/y direction
Z z dimension/z direction
10 stamp
12 rigid support
14 pedestal
15 pedestal layer
16 post
16A bottom portion
16B top portion
17 post layer
20 micro-device/chiplet/micro-transfer printable device
24 tether
30 source substrate/source wafer
32 sacrificial portion
34 anchor
40 destination substrate
42 adhesive layer
50 motion-control platform
60 micro-transfer printing system
100 provide motion-control platform step
110 provide stamp step
120 provide source substrate step
130 provide destination substrate step
135 optional coat adhesive layer on destination substrate step
140 optional set at operating temperature step
150 contact devices with stamp step
160 press stamp posts against devices step
170 remove stamp from source wafer step
180 contact devices to destination substrate step
190 remove stamp from destination substrate step
200 provide mold step
210 provide stamp material step
220 provide rigid support step
230 inject stamp material in mold step
240 cure stamp material step
250 cool stamp to operating temperature step
260 remove mold step

What is claimed:

1. A stamp for micro-transfer printing, comprising:
a rigid support having a support coefficient of thermal expansion (support CTE);
pedestals disposed on the rigid support, each of the pedestals spatially separated from any other of the pedestals, wherein the pedestals have a pedestal coefficient of thermal expansion (pedestal CTE) and the pedestal CTE is greater than the support CTE; and
posts disposed directly on and in contact with each of the pedestals, each post having a post coefficient of thermal expansion (post CTE) that is greater than the support CTE.

2. The stamp of claim 1, wherein the pedestals are disposed directly on and in contact with the rigid support.

3. The stamp of claim 1, wherein the posts and the pedestal comprise a same material.

4. The stamp of claim 1, wherein the post CTE is greater than the pedestal CTE.

5. The stamp of claim 1, wherein the pedestals are disposed in a regular array.

6. The stamp of claim 1, wherein the posts disposed on each of the pedestals comprises four or more posts disposed in a regular array on the pedestal.

7. The stamp of claim 1, wherein the posts disposed directly on and in contact with the pedestals are collectively disposed in a regular array over the rigid support.

8. The stamp of claim 1, wherein the stamp comprises a viscoelastic stamp material.

9. The stamp of claim 1, wherein the rigid support has a dimension no less than 25 mm.

10. The stamp of claim 1, wherein the posts have a length no greater than 200 µm.

11. The stamp of claim 1, wherein the pedestals each comprise polydimethylsiloxane formed from a mixture having a ratio of elastomer to curing agent in a range of 2:1 to 7:1 and the posts each comprise polydimethylsiloxane formed from a mixture having a ratio of elastomer to curing agent in a range of 7:1 to 14:1.

12. The stamp of claim 1, wherein the pedestals are spaced such that a maximum spacing between adjacent ones of the pedestals is less than a minimum extent of any of the pedestals over the rigid support.

13. The stamp of claim 12, wherein each of the pedestals has an extent over the rigid support that is no more than 25% larger than the area defined by a convex hull enclosing the posts disposed directly on and in contact with the pedestal.

14. The stamp of claim 1, wherein the pedestals and the posts both have a substantially rectangular or trapezoidal cross section in a direction orthogonal to a surface of the rigid support on which the pedestals are disposed.

15. The stamp of claim 1, wherein each post is a tiered post having a bottom portion in direct contact with the pedestal and a top portion in direct contact with the bottom portion.

16. The stamp of claim 15, wherein the top portion has a CTE that is greater than a CTE of the bottom portion.

17. A micro-transfer printing system, comprising:
- a stamp comprising
  - a rigid support having a support coefficient of thermal expansion (support CTE),
  - pedestals disposed on the rigid support, each of the pedestals spatially separated from any other of the pedestals, wherein the pedestals have a pedestal coefficient of thermal expansion (pedestal CTE) and the pedestal CTE is greater than the support CTE, and
  - posts disposed directly on and in contact with each of the pedestals, each of the posts having a post coefficient of thermal expansion (post CTE) that is greater than the support CTE;
- a source substrate comprising devices disposed in an arrangement corresponding to an arrangement of the posts;
- a destination substrate; and
- a motion-control platform attached to the stamp for controlling the stamp to contact the posts to the devices, remove the devices from the source substrate, and contact the devices to the destination substrate.

18. The micro-transfer printing system of claim 17, wherein the pedestals are disposed directly on and in contact with the rigid support.

19. The micro-transfer printing system of claim 17, comprising an adhesive layer disposed on the destination substrate.

20. The micro-transfer printing system of claim 17, wherein the stamp comprises stamp material that has a cure temperature and the motion-control platform has an operating temperature that is lower than the cure temperature.

\* \* \* \* \*